(12) United States Patent
Saito et al.

(10) Patent No.: US 6,709,984 B2
(45) Date of Patent: Mar. 23, 2004

(54) METHOD FOR MANUFACTURING SEMICONDUCTOR DEVICE

(75) Inventors: Go Saito, Yamaguchi (JP); Hiroaki Ishimura, Yamaguchi (JP); Yutaka Kudoh, Yamaguchi (JP); Masamichi Sakaguchi, Yamaguchi (JP); Kazuo Takata, Yamaguchi (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 10/216,720

(22) Filed: Aug. 13, 2002

(65) Prior Publication Data

US 2004/0033695 A1 Feb. 19, 2004

(51) Int. Cl.$^7$ .............................................. H01L 21/311
(52) U.S. Cl. ...................... 438/700; 438/701; 438/703; 438/706; 438/707; 438/708
(58) Field of Search ................................ 438/700, 701, 438/703, 706, 707, 708, 709, 710, 711, 713, 714, 717, 719, 728, 732, 736, 743, 746, 756, 757, 723, 724

(56) References Cited

U.S. PATENT DOCUMENTS

| | | | | |
|---|---|---|---|---|
| 4,693,781 A | * | 9/1987 | Leung et al. ............... | 438/696 |
| 4,857,477 A | * | 8/1989 | Kanamori ................... | 438/386 |
| 5,843,846 A | * | 12/1998 | Nguyen et al. ............. | 438/713 |
| 6,001,706 A | * | 12/1999 | Tan et al. .................... | 438/424 |
| 6,153,494 A | * | 11/2000 | Hsieh et al. ................. | 438/424 |
| 6,235,643 B1 | * | 5/2001 | Mui et al. .................... | 438/719 |
| 6,432,832 B1 | * | 8/2002 | Miller et al. ................. | 438/713 |
| 6,589,879 B2 | * | 7/2003 | Williams et al. ............ | 438/714 |

OTHER PUBLICATIONS

S, Wolf, Silicon Processing for the VLSI Era, vol. 2—Process Integration, 1990, pp. 51–54.*
TI's "Trench Technology Moves into the Factory", Electronics, Jul. 9, '87, p87.*
R. N. Carlile et al., "Trench Etches in Silicon with Controllable Sidewall Angle", Electrochem. Soc., Aug., 1988, p. 2058.*
G. K. Herb et al., "silicon Trench Etch in a Hex Reactor", Solid State Technology. Oct. 1967 p.109–115.*

* cited by examiner

Primary Examiner—Matthew Smith
Assistant Examiner—B. Keshavan
(74) Attorney, Agent, or Firm—Antonelli, Terry, Stout & Kraus, LLP

(57) ABSTRACT

A method for manufacturing a semiconductor device comprises etching a semiconductor substrate having an insulation film as mask using a mixed gas composed of HBr and CHF3, thereby having a reaction product composed of the semiconductor substrate and reaction gas to be adhered gradually on the side walls of the mask, and as a result creating a trench having a sufficient roundness formed to the upper end portion thereof.

2 Claims, 2 Drawing Sheets

METHOD FOR MANUFACTURING SEMICONDUCTOR DEVICE

FIELD OF THE INVENTION

The present invention relates to a method for manufacturing a semiconductor device, and especially relates to a manufacturing method for creating a trench on a semiconductor substrate using plasma.

DESCRIPTION OF THE RELATED ART

Along with the advance in the integration of semiconductor devices, it has become indispensable to reduce the element isolation distance utilizing trench isolation technology, which is a technique for isolating elements in a semiconductor device. According to trench isolation, a trench is formed on the semiconductor substrate, but if the upper surface of the semiconductor substrate, the side walls of the trench and the bottom surface of the trench are joined linearly, it is known that electric field concentration occurs at the joints (end regions). It is considered that crystal defect at the end region and unevenness of the padoxide film are the causes of such electric field concentration. This problem can be solved by rounding off the upper end portion and the lower end portion of the trench.

For example, Japanese Patent Laid-Open Provisional Publication No. 2001-345375 discloses rounding off the upper end portion of the trench using reactive gas containing HBr and CF4 with a remaining resist mask layer used as the mask.

According to the above example where the resist is used as the mask for rounding off the upper end of the trench in processing the semiconductor substrate, consideration is made on the possible contamination of the semiconductor substrate caused by the resist which may affect the semiconductor characteristics, so in some cases after using the resist as mask to process the insulating layer on the semiconductor substrate, the resist is removed and the insulation layer is used as the mask to form the trench on the semiconductor substrate. According to such example, however, it is difficult to create a sufficient roundness to the upper end portion of the trench when an etching gas selected in expectation of the reaction product with the resist is used.

SUMMARY OF THE INVENTION

The object of the present invention is to solve the problems of the prior art. The present invention provides a method for manufacturing a semiconductor device comprising forming openings to the insulation layer using a resist as the mask, removing the resist, and processing the semiconductor substrate utilizing the insulation layer as the mask to create a sufficient roundness to the upper end of the trench of the semiconductor substrate.

In order to solve the prior art problems, the present invention utilizes a surface processing device comprising a vacuum chamber, a means for generating plasma within the chamber, a sample stage onto which the sample receiving surface processing using plasma is mounted, and a power source for applying high frequency voltage to the sample stage, wherein a semiconductor substrate having an insulation layer as mask is etched using mixed gas including HBr gas and CHF3 gas, the reaction product thereof being adhered to the side walls of the pattern, and then performing fine etching of the adhered side walls so as to create a rounding having sufficient size to the upper end of the trench.

DETAILED DESCRIPTION OF THE PREFERRED EMBODIMENT

A preferred embodiment of the present invention will now be explained with reference to FIGS. 1 and 2.

Figure 1:
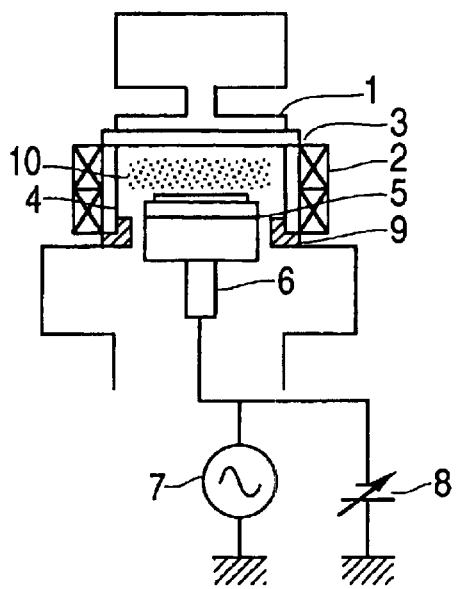
FIG. 1 illustrates the outline of the etching device utilized in the explanation of the embodiment of the present invention.
Figure 2A:
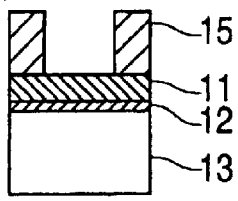
FIG. 2 is a cross-sectional view illustrating the main portion of the semiconductor substrate explaining the embodiment of the present invention.
Figure 2D:
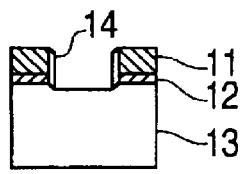
Figure 2B:
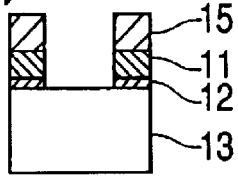
Figure 2E:
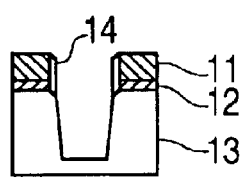
Figure 2C:
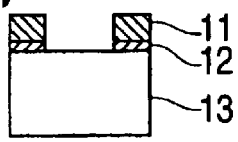
Figure 3A:
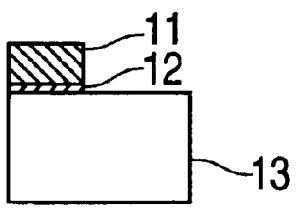
FIG. 3 is a cross-sectional view illustrating the main portion of the semiconductor substrate explaining another embodiment of the present invention.
Figure 3C:
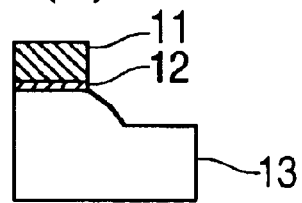
Figure 3B:
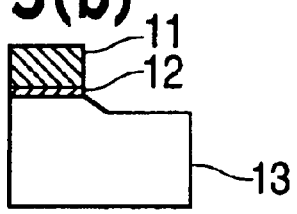
Figure 3D:
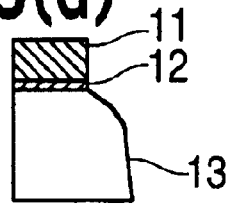

FIG. 1 illustrates in detail the plasma generation unit of the plasma processing device. The present embodiment utilizes UHF waves and magnetic field as means for generating plasma. According to FIG. 1, reference number 1 denotes an antenna for introducing the UHF waves, 2 denotes a solenoid coil for generating a magnetic field, 3 denotes a UHF wave transmission window (such as a silica plate), 4 denotes a vacuum chamber, 5 denotes a sample stage for mounting a sample which is a wafer, 6 denotes a driving mechanism for moving the stage up and down, 7 denotes a high frequency power source for applying high frequency bias voltage to the sample stage during plasma treatment such as etching, and 8 denotes a static attraction power source for statically attracting and supporting the wafer mounted on the sample stage. In the interior of the vacuum chamber 4, an earth electrode 9 being a ground potential member is disposed near the sample stage 5 also being an electrode. The earth electrode 9 is set to ground potential, which is mounted to the inner side of the vacuum chamber 4 functioning so as to secure the electrical conductivity between the vacuum chamber 4 and plasma 10.

According to this device, when providing an etching treatment to a wafer (sample), process gas is introduced to the interior of the vacuum chamber 4 which is evacuated by a vacuum pump (not shown) and a turbo molecular pump (not shown). The pressure within the vacuum chamber is adjusted by a variable valve (not shown), and then UHF waves are introduced to the interior of the chamber using the antenna 1.

By the function of the magnetic field created by the solenoid coil 2 wound around the exterior of the vacuum chamber 4 and the UHF waves introduced by the antenna 1 through the UHF wave transmission window 3, the electrons within the process gas receive energy efficiently, thereby generating a high-density plasma 10 by electron cyclotron resonance (hereinafter abbreviated ECR). After the plasma 10 is generated, the static attraction power source 8 outputs DC voltage for attracting the wafer on the sample stage 5. After the wafer is attracted on the stage 5, high frequency bias voltage is output from the high frequency power source 7 to start the processing.

FIG. 2 illustrates a method for manufacturing the semiconductor device according to a preferred embodiment of the present invention utilizing the device shown in FIG. 1.

The preferred embodiment of the present invention will now be explained with reference to FIG. 2.

As shown in FIG. 2, a resist 15 is already patterned corresponding to exposure regions. The patterned resist 15 is used as a pattern to perform etching to a mask composed of a pad oxide film 12 and a silicon nitride 11 using a dedicated etching device. Thereafter, a separate ashing device is used to remove the resist, and then either the above-mentioned etching device or another etching device is used to etch the silicon substrate 13 using a mixed gas including CHF3 and HBr as etching gas.

A first etching is performed for 15 seconds with the etching conditions set so that the pressure is 2.0 Pa and the gas flow ratio of HBr/CHF3 at this time is substantially 5/1 (the ratio of the amount of CHF3 gas against HBr gas being approximately 20%), while adding approximately 3 mL/min of O2 gas for controlling the reaction product on the wafer surface. Thereafter, a second etching is performed utilizing CL2, O2 and HBr gas to form the main trench portion.

During the first etching, a reaction product caused by silicon substrate 13 and etching gas is gradually adhered onto the side surfaces of the mask as side walls 14. At this time, the silicon substrate 13 is anisotropically etched, thus the finished cross-section has a forward taper shape.

The shape of the forward taper can be controlled by adjusting the added O2 gas, the total gas flow, the pressure and so on.

Thereafter, the second etching is performed to realize element isolation. At this time, the side walls 14 created (adhered) by the first etching is also somewhat etched, so the upper end portion projecting in the element isolation region is also etched, thus being connected smoothly with the second etched portion.

If it is not desirable to greatly etch the upper end projecting in the element isolation region, a mixed gas including HBr, O2 and CF4 can be used to form the main trench portion.

Next, FIG. 3 is referred to in explaining the example where it is preferable to etch greatly the upper end projected in the element isolation region.

The embodiment illustrated in FIG. 3 is different from that of FIG. 2 in that according to FIG. 3, the first etching time is reduced from approximately 15 seconds to about 5 seconds (the wafer bias unchanged, which is approximately 100 W), and then after reducing the wafer bias from approximately 100 W to 20 W, performing etching for about 10 seconds. According to such etching conditions and etching steps, it is possible to vary the angle of the taper and to provide roundness in a more aggressive manner.

Moreover, since it is desirable to provide sufficient roundness to the lower end of the trench, it is possible to etch the bottom portion of the trench by adjusting the power supplied by the high frequency power source or by utilizing HBr, O2 and CF4 gas.

Next, with reference to FIG. 4, the etching process performed to provide roundness to the bottom surface of the trench portion will be explained.

Figure 4A:
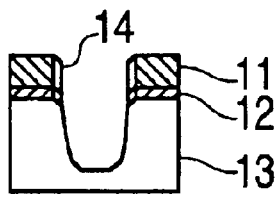
FIG. 4 is a cross-sectional view illustrating the main portion of the semiconductor substrate explaining another embodiment of the present invention.

According to the embodiment of FIG. 4, at approximately 80–90% of the desired trench depth, the wafer bias is reduced from approximately 100 W to 20 W before performing further etching, thus creating a sufficient roundness.

As explained, the present embodiment enables to create a sufficient roundness to the upper end portion of the trench formed to the semiconductor substrate without having to perform processes other than etching, such as deposition and thermal oxidation, to the semiconductor device.

Although the present embodiment is explained where UHF waves and magnetic field are used as means for generating plasma, but the present invention is not limited to such example. In other words, the present invention can not only be applied to ECR plasma system, but also to semiconductor devices utilizing other plasma systems such as RF plasma.

According to present invention, by processing a resist as a mask, removing the resist, utilizing an insulation film as mask on the semiconductor substrate when etching the substrate so that the reaction product is adhered on the side walls of the mask, a sufficient roundness is created to the upper end portion of the trench.

What is claimed is:

1. A method for manufacturing a semiconductor device comprising:

a step of forming a multilayer-film mask layer having openings corresponding to element isolation regions on a semiconductor substrate;

a first etching step of etching said semiconductor substrate using a mixed gas including $CHF_3$ and HBr and utilizing said multilayer-film mask layer as mask; and a second etching step of etching said semiconductor substrate using a mixed gas including $Cl_2$, $O_2$ and HBr and utilizing said multilayer-film mask layer as mask.

2. A method for manufacturing a semiconductor device according to claim 1, wherein the ratio of mixed gas including $CHF_3$ and HBr is 1:5, and the ratio of mixed gas including $Cl_2$, $O_2$ and HBr is 5:1:20.

* * * * *